United States Patent
Bouchez et al.

(10) Patent No.: US 12,283,946 B2
(45) Date of Patent: Apr. 22, 2025

(54) ELECTRONIC DRIVER CIRCUIT FOR DRIVING A FIELD-EFFECT TRANSISTOR

(71) Applicant: Valeo eAutomotive France SAS, Cergy (FR)

(72) Inventors: Boris Bouchez, Drammen (NO); Baptiste Dumenil, Cergy (FR)

(73) Assignee: Valeo eAutomotive France SAS, Cergy (FR)

( * ) Notice: Subject to any disclaimer, the term of this patent is extended or adjusted under 35 U.S.C. 154(b) by 87 days.

(21) Appl. No.: 18/248,330

(22) PCT Filed: Oct. 6, 2021

(86) PCT No.: PCT/EP2021/077613
§ 371 (c)(1),
(2) Date: Apr. 7, 2023

(87) PCT Pub. No.: WO2022/074074
PCT Pub. Date: Apr. 14, 2022

(65) Prior Publication Data
US 2023/0378953 A1 Nov. 23, 2023

(30) Foreign Application Priority Data
Oct. 9, 2020 (FR) ................................ 20 10346

(51) Int. Cl.
*H03K 17/041* (2006.01)
*H03K 17/0412* (2006.01)
*H03K 17/16* (2006.01)

(52) U.S. Cl.
CPC ..... *H03K 17/162* (2013.01); *H03K 17/04123* (2013.01)

(58) Field of Classification Search
CPC ................. H03K 17/04123; H03K 17/162
(Continued)

(56) References Cited

U.S. PATENT DOCUMENTS

2021/0318375 A1\* 10/2021 Lee ................. G01R 31/2608

FOREIGN PATENT DOCUMENTS

EP 0 980 141 A1 2/2000

OTHER PUBLICATIONS

Mingliang et al., "Intelligent Power Module Featuring Optimized Active Gate Driver and IGBT Module Integration for Electric Vehicle Application", 2018 7$^{th}$ Electronic System-Integration Technology Conference (ESTC), Sep. 18, 2018 pp. 1-5, XP033452908.

\* cited by examiner

*Primary Examiner* — William Hernandez
(74) *Attorney, Agent, or Firm* — Oblon, McClelland, Maier & Neustadt, L.L.P.

(57) ABSTRACT

An electrical circuit includes a MOSFET and an electronic driver circuit for driving the MOSFET, having four pins, the electrical circuit including at least one electrical track to which the MOSFET is connected by a bond wire having an intrinsic inductance. The electronic driver circuit is connected to the MOSFET by a first terminal directly linked to the first source and, in parallel, by a second terminal linked to the second source. The bond wire is arranged between the second terminal and the second source. The electronic driver circuit is configured so as to apply an electrical driver signal between the gate and the first source or between the gate and the second source of the MOSFET, in order to trigger a change of state of the MOSFET to the OFF state or to the ON state, respectively.

17 Claims, 2 Drawing Sheets

(58) Field of Classification Search
USPC ......... 327/108, 109, 110, 111, 429, 577, 581
See application file for complete search history.

ELECTRONIC DRIVER CIRCUIT FOR DRIVING A FIELD-EFFECT TRANSISTOR

TECHNICAL FIELD

The present invention concerns the field of field-effect transistors, more precisely MOSFETs. Even more precisely, the present invention relates to optimization of the use of four-pin silicon-carbide MOSFETs.

PRIOR ART

MOSFETs are a type of transistor that is well known to a person skilled in the art who generally refers to them under this acronym which stands for "Metal-Oxide-Semiconductor Field-Effect Transistor".

The main function of MOSFETs is to switch, that is to say to transition from a high state to a low state, in other words from an ON state to an OFF or "blocked" state. In general, it is sought to obtain switching that is fast and oscillation-free, which is difficult to achieve in practice. Specifically, fast transistors generally tend to oscillate after switching, that is to say to have an output voltage which oscillates around their new state after switching.

Conversely, transistors which switch in a precise and oscillation-free manner are generally slower. Nowadays, use is commonly made of MOSFETs of silicon-carbide (SiC) type, the latter being considered as being able to switch quickly and with low losses.

Conventionally, MOSFETs comprise three pins, called gate, source and drain, respectively. An electrical driver signal applied to the gate makes it possible to switch the MOSFETs, in particular their transition to the ON state or to the OFF state.

More recently, four-pin MOSFETs have been developed. They make it possible in practice to decorrelate the control of the power. This type of MOSFET, having four pins, is particularly useful when it is desired to switch quickly, involving changes in voltages of several hundred volts and currents possibly reaching several tens of amperes in a few nanoseconds. Such MOSFETs are implemented, for example, in power converters, inverters, on-board chargers, in particular for electric or hybrid vehicles.

Four-pin MOSFETs thus allow fast switching operations with small losses since the power of the electrical energy transferred via such a MOSFET is separated from the electrical path followed by the electrical driver signal generated in the electronic driver circuit so as to allow the switching, in other words the change of state, of said MOSFET. Compared to a conventional three-pin MOSFET, the source is thus split into two, between a first source (power source) and a second source (driver source). The electrical driver signal and the power signal (also referred to as load signal), corresponding to the electrical energy to be switched, are electronically decorrelated: they do not describe the same electrical path and are not linked to the same "source" pin of the MOSFET, the electrical driver signal being connected to the driver source of the MOSFET and the power signal being connected to the power source of the MOSFET.

According to the prior art, the electronic driver circuit thus forms a "powerless" loop, in other words with a very low power, corresponding only to the power of the electrical driver signal, namely a power of the order of a few hundred mW. Independently, the signal corresponding to the electrical energy to be transferred is routed by an electronic power circuit, realizing a power of the order of 1 to 100 kW.

The operating principle of four-pin MOSFETs is known per se. It is for example described in the document "Simultaneous On-State Voltage and Bond-Wire Resistance Monitoring of Silicon Carbide MOSFETs", Baker et al., published on 18 Mar. 2017.

In this context, it is noted that with a conventional MOSFET electronic driver circuit, switching operations are obtained upon the transition to ON and upon the transition to OFF which have differing advantages and disadvantages, between a three-pin MOSFET and a four-pin MOSFET. In essence, a three-pin MOSFET switches to ON slowly but has the advantage of not oscillating upon the transition to OFF.

A four-pin MOSFET acts in the opposite way: it switches to ON very quickly (and with lower losses) but has the disadvantage of having an output voltage which oscillates strongly upon the transition to OFF.

Therefore, there exists a need for a field-effect transistor of MOSFET type which is able to switch to ON quickly and with limited losses and which does not oscillate when it is switched to OFF.

To this end, the present invention provides a novel electronic driver circuit for driving a four-pin MOSFET.

PRESENTATION OF THE INVENTION

More precisely, the subject of the invention is an electrical circuit comprising a MOSFET and an electronic driver circuit for driving said MOSFET, having four pins including a drain, a gate, a first source and a second source, said MOSFET having an ON state and an OFF state, said electrical circuit comprising at least one electrical track and said MOSFET being connected to said at least one electrical track by way of at least one bond wire, said at least one bond wire having an intrinsic inductance, said electronic driver circuit being connected to the MOSFET by a first terminal directly linked to the first source and, in parallel, by a second terminal linked to the second source, said at least one bond wire having an intrinsic inductance being arranged between the second terminal and the second source. The electronic driver circuit is configured so as to apply an electrical driver signal between the gate and the first source or between the gate and the second source of the MOSFET, in order to trigger a change of state of said MOSFET, and such that:
when the electrical driver signal is intended to transition the MOSFET to the OFF state, the electronic driver circuit applies the electrical driver signal between the gate and the first source, and
when the electrical driver signal is intended to transition the MOSFET to the ON state, the electronic driver circuit applies the electrical driver signal between the gate and the second source.

The invention makes it possible to profit both from a fast switching of the MOSFET to the ON state and from a switching to the OFF state with limited losses and oscillations.

According to one embodiment, the electronic driver circuit comprises a bridge of switches with a first switch and a second switch connected in parallel, respectively between a voltage source emitting the electrical driver signal and the first source of the MOSFET and between said voltage source emitting the electrical driver signal and the second source of the MOSFET, the first switch being in an ON state and the second switch being in an OFF state when the electrical driver signal is intended to transition the MOSFET to the ON state, and, respectively, the first switch being in an OFF state and the second switch being in an ON state when the electrical driver signal is intended to transition the MOSFET to the OFF state.

According to one embodiment, the electronic driver circuit comprises a bridge of diodes with a first diode and a second diode connected in parallel, respectively between the first source of the MOSFET and an electrical earth of the electronic driver circuit and between the second source of the MOSFET and said electrical earth of the electronic driver circuit, the first diode being configured to block any flow of an electrical current through said at least one bond wire when the MOSFET is driven via the second source, and, respectively, the second diode being configured to block any flow of an electrical current via the second source when the MOSFET is driven via the first source.

The invention likewise pertains to an item of electrical equipment comprising an electrical circuit such as briefly described above.

The invention furthermore pertains to an electrical transformer comprising an electrical circuit such as briefly described above.

The invention moreover pertains to an inverter comprising an electrical circuit such as briefly described above.

The invention also pertains to a power converter comprising an electrical circuit such as briefly described above.

The invention likewise pertains to a motor vehicle comprising an item of electrical equipment such as briefly described above.

PRESENTATION OF THE FIGURES

The invention will be better understood from reading the following description, given solely by way of example, and with reference to the attached drawings given by way of non-limiting examples, in which identical references are given to similar objects and in which.

It will be noted that the figures illustrate the invention in a detailed manner, with a view to allowing implementation of the invention, said figures possibly of course serving to better define the invention where appropriate.

DETAILED DESCRIPTION OF THE INVENTION

Figure 1:
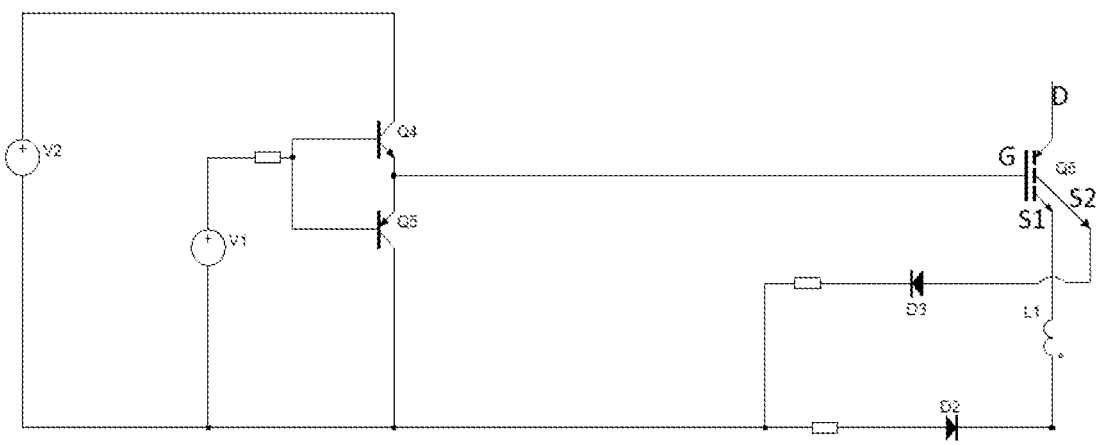
FIG. 1 is a schematic representation of an electrical circuit with a MOSFET and an electronic driver circuit for driving said MOSFET, in accordance with one exemplary embodiment of the invention.

With reference to FIG. 1, as is known, in a MOSFET, the voltage applied to the gate G, more precisely between the gate G and the source S1, S2, makes it possible to control the flow of a current between the source S1, S2 and the drain D, which passes through the MOSFET. As explained previously, a four-pin MOSFET, having two sources S1, S2 including a cold source, makes it possible to drive the change of state of the MOSFET by means of an electrical driver signal which follows an electrical path different to that corresponding to the electrical energy which is switched—in other words transferred—by means of said MOSFET.

In a known manner, an electronic driver circuit delivers a supply signal V2 and an electrical driver signal V1, for example from a pulse-width modulator (also referred to as PWM). In other words, the electrical driver signal V1 refers to a voltage applied to the gate G of the MOSFET Q6, allowing the latter, where appropriate, to change state, to transition to an ON state, in which said MOSFET Q6 switches—or transfers—electrical energy to the drain D, or to transition to an OFF state, in which said MOSFET Q6 does not transfer any electrical energy.

As is furthermore known, a MOSFET is connected in an electrical circuit by means of bond wires, also referred to as wire bondings, in other words conductors, making it possible to electrically link said MOSFET to the electrical tracks of said electrical circuit. These bond wires have an intrinsic inductance, referenced L1 in FIG. 1.

The intrinsic inductance L1 thus acts as a parasitic inductance and corresponds to the inductance of the conductors forming said bond wires.

According to the invention, the electronic driver circuit for driving the four-pin MOSFET Q6 is configured so that, when the MOSFET Q6 is driven to transition to the ON state, the electrical driver signal does not pass through the intrinsic inductance L1. In other words, the MOSFET Q6 is driven to transition to the ON state without power. As the electrical driver signal does not pass through the intrinsic inductance L1, in other words the intrinsic inductance of the bond wires linking the MOSFET Q6 to the electrical tracks of the electrical circuit, no counteraction is produced (the intrinsic inductance L1 does not generate during the driving any counteraction which opposes the passage of the current corresponding to said electrical driver signal). The transition of the MOSFET Q6 to the ON state is therefore fast.

Conversely, the electronic driver circuit, according to the invention, is configured so that, when the MOSFET Q6 is driven to transition to the OFF state, the electrical driver signal passes through the intrinsic inductance L1. In other words, the MOSFET Q6 is driven to transition to the OFF state with power. The intrinsic inductance L1 provides a counteraction and generates, in the driver circuit, a supplementary voltage that opposes the change in the current and in the voltage across its terminals. In doing so, this counteraction induced by the presence of the inductance in the driver circuit limits the oscillations of the current passing through the MOSFET Q6. The high-frequency oscillations of the voltage and the voltage peak at the output of the MOSFET Q6, and the corresponding electromagnetic interference, are thus reduced.

To this end, the electronic driver circuit for driving the four-pin MOSFET, in accordance with the invention, comprises a bridge of switches Q4, Q5 that are configured to switch such that the electrical driver signal V1 applied to the gate G is applied precisely between the gate G and the first source S1, in other words the power source, or between the gate G and the second source S2, in other words the driver source, also referred to as the cold source or Kelvin source, according to whether the driving pertains to the transition of the MOSFET Q6 to the OFF state or to the ON state.

In other words, the electronic driver circuit comprises two distinct electrical paths. One is directly linked to the cold source, in other words the second source S2, or else the driver source or the Kelvin source, without passing through the bond wires. The other electrical path is linked to the first source S1, in other words the power source, and passes through the bond wires and therefore the intrinsic inductance L1.

According to one embodiment, a bridge of diodes D2, D3 is furthermore provided in order to guarantee that the current which passes through the MOSFET Q6 is able to pass through the intrinsic inductance L1 only when said MOSFET Q6 is driven so as to transition to the OFF state. Said bridge of diodes D2, D3 comprises two diodes D2, D3 in parallel, connected to the first source S1 and to the second source S2, respectively, and configured to prevent the electrical current that is passing through the MOSFET Q6 from looping back via said first source S1 during the transition to the ON state of the MOSFET Q6 and, respectively, from looping back via the second source S2 during the transition to the OFF state of the MOSFET Q6.

The present invention thus makes it possible to have an electrical circuit with a four-pin MOSFET Q6 and an electronic driver circuit for driving said MOSFET Q6. The electronic driver circuit is configured to drive the change of state of the MOSFET Q6 via the first source S1 or via the second source S2, according to whether MOSFET Q6 is intended to transition to the OFF state or to the ON state, respectively.

In this way, upon transition of the MOSFET Q6 to the ON state, the inductance L1 is shunted by connecting the electrical driver signal to the cold source (second source S2) of the MOSFET Q6, so as to avoid the counteraction which would be produced by said inductance L1, as a result of which the change of state of said MOSFET Q6 is faster. The losses during the transition of the MOSFET Q6 to the ON state are thus minimized.

If the power source (first source S1) has been passed through for the transition of the MOSFET Q6 to the ON state, a change of state would have been slower and with more losses. The present invention makes it possible to avoid this pitfall.

Figure 2:
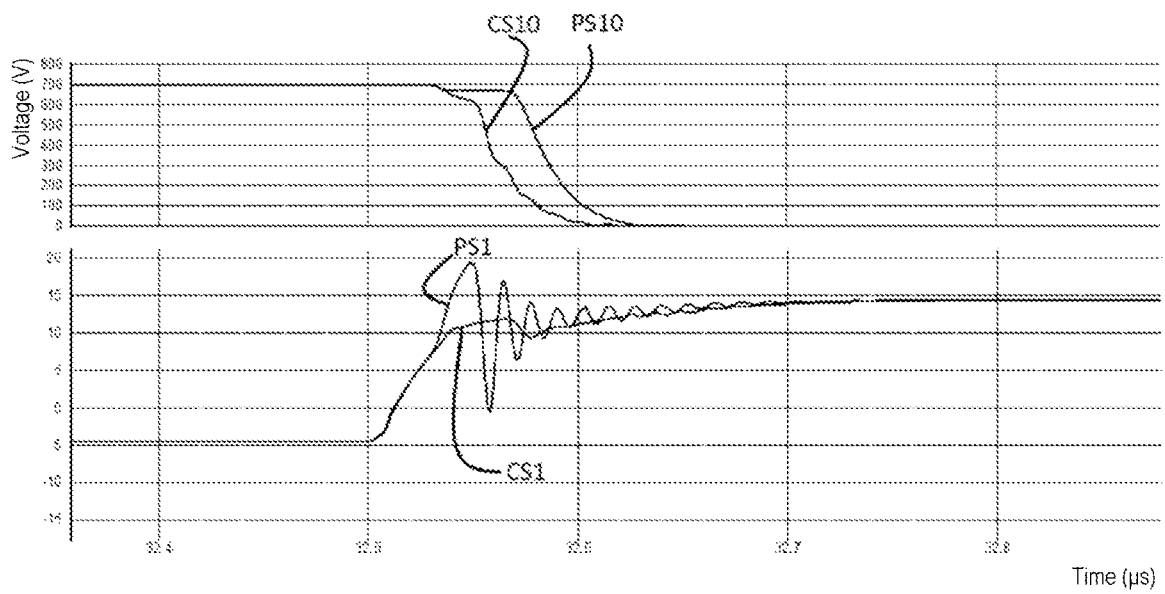
FIG. 2 shows two graphs each with two curves respectively showing the voltage across the terminals of the MOSFET during its transition to the ON state and the drive voltage of the MOSFET, applied between the gate and the—cold or power—source during its transition to the ON state.

This is what can be seen in FIG. 2 which shows the results of simulations relating to the transition of the MOSFET Q6 to the ON state. The curve CS10 shows the output voltage of the MOSFET Q6 during a transition to the ON state, with driving applied to the cold source. The curve CS1 shows the voltage between the gate and the cold source of the MOSFET Q6 during a transition to the ON state, with driving applied to the cold source. The curve PS10 shows the output voltage of the MOSFET Q6 during a transition to the ON state, with driving applied to the power source. The curve PS1 shows the voltage between the gate and the power source of the MOSFET Q6 during a transition to the ON state, with driving applied to the power source.

Thus, in particular, these simulations that can be seen in FIG. 2 show a first curve PS10 representing the output voltage of the MOSFET Q6 driven so as to transition to the ON state via an electrical driver signal applied between the gate G and the first source S1 and, respectively, a second curve CS10 representing the output voltage of the MOSFET Q6 driven so as to transition to the ON state via an electrical driver signal applied between the gate G and the second source S2. It is clear that the first curve PS10 has a slower rise time, which is problematic, as explained previously. This is why, according to the invention, the electronic driver circuit for driving the four-pin MOSFET Q6 is configured to drive a transition to the ON state of said MOSFET Q6 by way of a driver signal V2 applied between the gate G and the second source S2, in other words the cold source.

Upon the transition of the MOSFET Q6 to the OFF state, in contrast, use is made of the counteraction produced by the intrinsic inductance L1 of the bond wires electrically linking said MOSFET Q6 to the electrical tracks of the electrical circuit, so as to reduce the oscillations of the voltage at the output of the MOSFET Q6 and so as to also reduce the associated voltage peak.

Figure 3:
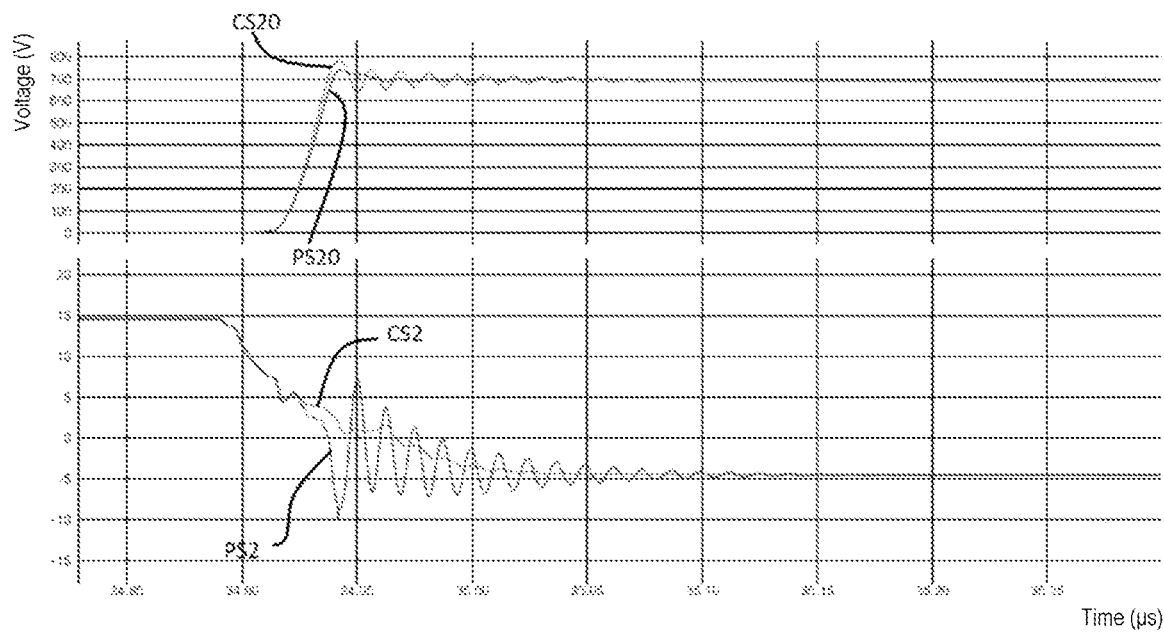
FIG. 3 shows two graphs each with two curves respectively showing the voltage across the terminals of the MOSFET and the drive voltage of the MOSFET, applied between the gate and the—cold or power—source during its transition to the OFF state.

If the cold source has been passed through for the transition of the MOSFET Q6 to the OFF state, a change of state would have been more noisy: the output voltage of the MOSFET Q6 would oscillate at a higher frequency and would have a higher voltage peak, as can be seen in the curve PS2 of the simulation that can be seen in FIG. 3. The present invention makes it possible to avoid this pitfall.

This is what can be seen in FIG. 3 which shows the results of simulations relating to the transition of the MOSFET Q6 to the OFF state. The curve CS20 shows the output voltage of the MOSFET Q6 during a transition to the OFF state, with driving applied to the cold source. The curve CS2 shows the voltage between the gate and the cold source of the MOSFET Q6 during a transition to the OFF state, with driving applied to the cold source. The curve PS20 shows the output voltage of the MOSFET Q6 during a transition to the OFF state, with driving applied to the power source. The curve PS2 shows the voltage between the gate and the power source of the MOSFET Q6 during a transition to the OFF state, with driving applied to the power source.

In particular, these simulations that can be seen in FIG. 3 show a first curve PS20 representing the output voltage of the MOSFET Q6 driven so as to transition to the OFF state via an electrical driver signal V1 applied between the gate G and the first source S1 and, respectively, a second curve CS20 representing the output voltage of the MOSFET Q6 driven so as to transition to the OFF state via an electrical driver signal applied between the gate G and the second source S2. It is clear that the second curve CS20 has more oscillations and a higher voltage peak, which is problematic, as explained previously, in particular in terms of losses and electromagnetic interference. This is why, according to the invention, the electronic driver circuit of the four-pin MOSFET Q6 is configured to drive a transition to the OFF state of said MOSFET Q6 by way of a driver signal V2 applied between the gate G and the first source S1, in other words the power source.

The electronic driver circuit for driving a four-pin MOSFET according to the invention achieves the best compromise between a three-pin MOSFET and a four-pin MOSFET. Thus, a faster transition of the MOSFET to the ON state is achieved, via an electrical driver signal applied between the gate and the cold source (second source S2), and a transition of the MOSFET to the OFF state with fewer oscillations of the output voltage and a lower voltage peak, and therefore fewer losses and less electromagnetic interference, via an electrical driver signal applied between the gate G and the power source (first source S1).

The invention claimed is:

1. Electrical circuit comprising a MOSFET and an electronic driver circuit for driving said MOSFET, having four pins including a drain, a gate, a first source and a second source, said MOSFET having an ON state and an OFF state, said electrical circuit comprising at least one electrical track and said MOSFET being connected to said at least one electrical track by way of at least one bond wire, said at least one bond wire having an intrinsic inductance, said electronic driver circuit being connected to the MOSFET by a first terminal linked to the first source and, in parallel, by a second terminal linked to the second source, said at least one bond wire having the intrinsic inductance being arranged between the first terminal and the first source, and the electronic driver circuit being configured so as to apply an electrical driver signal between the gate and the first source or between the gate and the second source of the MOSFET, in order to trigger a change of state of said MOSFET, and such that:

when the electrical driver signal is intended to transition the MOSFET to the OFF state, the electronic driver circuit applies the electrical driver signal between the gate and the first source, and when the electrical driver signal is intended to transition the MOSFET to the ON state, the electronic driver circuit applies the electrical driver signal between the gate and the second source.

2. Electrical circuit according to claim 1, wherein the electronic driver circuit comprises a bridge of switches with a first switch and a second switch connected in parallel, respectively between a voltage source emitting the electrical driver signal and the first source of the MOSFET and between said voltage source emitting the electrical driver signal and the second source of the MOSFET, the first switch being in an ON state and the second switch being in an OFF state when the electrical driver signal is intended to transition the MOSFET to the ON state, and, respectively, the first switch being in an OFF state and the second switch being in an ON state when the electrical driver signal is intended to transition the MOSFET to the OFF state.

3. Electrical circuit according to claim 2, wherein the electronic driver circuit comprises a bridge of diodes with a first diode and a second diode connected in parallel, respectively between the first source of the MOSFET and an electrical earth of the electronic driver circuit and between the second source of the MOSFET and said electrical earth of the electronic driver circuit, the first diode being configured to block any flow of an electrical current through said at least one bond wire when the MOSFET is driven via the second source, and, respectively, the second diode being configured to block any flow of an electrical current via the second source when the MOSFET is driven via the first source.

4. Item of electrical equipment comprising an electrical circuit according to claim 2.

5. Electrical transformer comprising an electrical circuit according to claim 2.

6. Inverter comprising an electrical circuit according to claim 2.

7. Power converter comprising an electrical circuit according to claim 2.

8. Electrical circuit according to claim 1, wherein the electronic driver circuit comprises a bridge of diodes with a first diode and a second diode connected in parallel, respectively between the first source of the MOSFET and an electrical earth of the electronic driver circuit and between the second source of the MOSFET and said electrical earth of the electronic driver circuit, the first diode being configured to block any flow of an electrical current through said at least one bond wire when the MOSFET is driven via the second source, and, respectively, the second diode being configured to block any flow of an electrical current via the second source when the MOSFET is driven via the first source.

9. Item of electrical equipment comprising an electrical circuit according to claim 8.

10. Electrical transformer comprising an electrical circuit according to claim 8.

11. Inverter comprising an electrical circuit according to claim 8.

12. Power converter comprising an electrical circuit according to claim 8.

13. Item of electrical equipment comprising an electrical circuit according to claim 1.

14. Motor vehicle comprising an item of electrical equipment according to claim 13.

15. Electrical transformer comprising an electrical circuit according to claim 1.

16. Inverter comprising an electrical circuit according to claim 1.

17. Power converter comprising an electrical circuit according to claim 1.

* * * * *